United States Patent [19]
Royal

[11] Patent Number: 6,076,906
[45] Date of Patent: Jun. 20, 2000

[54] ENTERTAINMENT CENTER FOR STORING ELECTRONIC COMPONENTS

[76] Inventor: Keith Royal, 321 S. Greenwood, Park Ridge, Ill. 60068

[21] Appl. No.: 09/246,437

[22] Filed: Feb. 8, 1999

[51] Int. Cl.$^7$ .................................................. A47B 81/00
[52] U.S. Cl. ...................... 312/273; 312/321.5; 312/322; 312/223.1
[58] Field of Search .............................. 312/223.1, 223.3, 312/110, 321.5, 322, 323, 311, 139.1, 270.1, 270.2, 270.3, 273, 291, 292, 302, 295, 298, 23, 24, 25, 26, 27, 28, 8.2, 8.5, 8.12

[56] References Cited

U.S. PATENT DOCUMENTS

| | | | |
|---|---|---|---|
| 2,104,939 | 1/1938 | Whalen | 312/322 X |
| 2,532,405 | 12/1950 | Jakeway | 312/273 X |
| 3,078,133 | 2/1963 | Schauer | 312/321.5 |
| 4,120,548 | 10/1978 | Manor | 312/270.2 X |
| 4,174,486 | 11/1979 | Winkler | 312/321.5 |
| 4,480,880 | 11/1984 | Cather | 312/273 X |
| 4,974,912 | 12/1990 | Rask et al. | 312/110 |
| 5,145,245 | 9/1992 | Fierthaler | 312/321.5 |
| 5,558,418 | 9/1996 | Lambright et al. | 312/223.3 X |
| 5,842,758 | 12/1998 | Kelley | 312/223.3 X |

FOREIGN PATENT DOCUMENTS

| | | | |
|---|---|---|---|
| 871599 | 5/1971 | Canada | 312/302 |
| 56506 | 11/1968 | Poland | 312/302 |

OTHER PUBLICATIONS

Avtrak Brochure, "One Good Turn Deserves Another", Avtrak Easy Access Systems, Nov. 1998, pp. 1–2.
Avtrak Brochure, "Installation Done With Eas", Nov. 1998, pp. 1–3.

*Primary Examiner*—Peter M. Cuomo
*Assistant Examiner*—James O. Hansen
*Attorney, Agent, or Firm*—Marshall, O'Toole, Gerstein, Murray & Borun

[57] ABSTRACT

A cabinet, such as an entertainment center, for housing electronic components such that access may be gained to the rear wired portion of the electronic components is disclosed. The cabinet comprises an enclosure having a top wall, a bottom wall, and a pair of interconnecting sidewalls. A panel includes first and second vertical edges, with the first vertical edge being pivotally connected to one of the enclosure sidewalls in order to permit the panel to be shifted between a first position in which the panel is disposed generally parallel to the enclosure first sidewall, and a second position in which the panel is disposed generally perpendicular to the enclosure first sidewall. A shelf unit is adapted to receive an electronic component and is slidably mounted to the panel such that the shelf unit is shiftable along a horizontal path. The shelf unit is shiftable between a stowed position in which the shelf unit is disposed within the enclosure and an extended position in which the shelf unit extends from the enclosure. Accordingly, upon sliding the shelf unit to the extended position the panel may be pivoted to the second position, thereby providing access to the rear wired portion of the electronic components stored on the shelf unit.

20 Claims, 8 Drawing Sheets

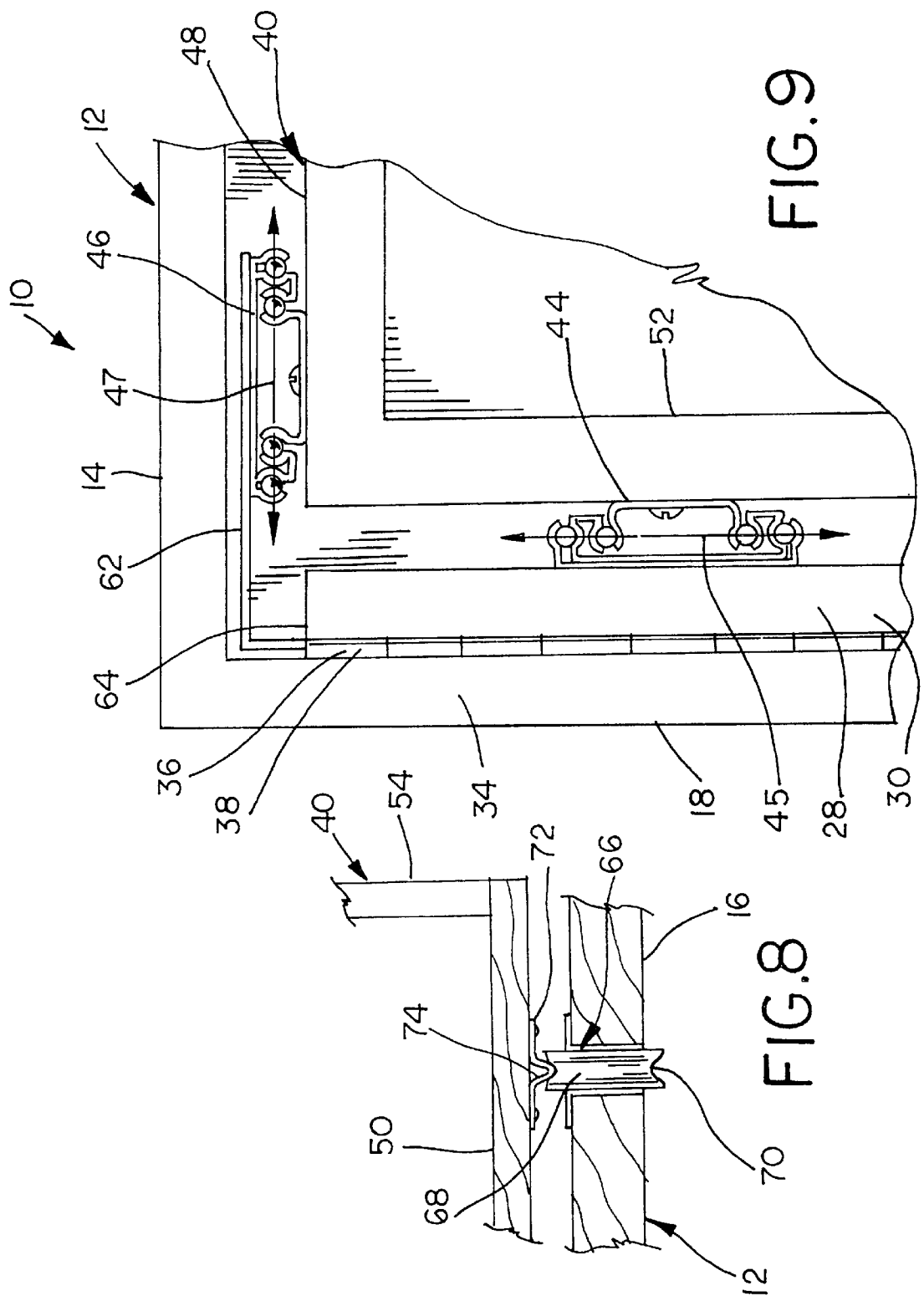

ENTERTAINMENT CENTER FOR STORING ELECTRONIC COMPONENTS

FIELD OF THE INVENTION

The present invention relates generally to cabinets, such as entertainment centers, having one or more shelves adapted to hold electronic components. More specifically, the present invention relates to a cabinet having a pull-out, pivoting shelf unit which provides access to the rear-wired portion of the electronic components stored on the shelf unit.

BACKGROUND OF THE INVENTION

With the advent of inexpensive consumer electronics, most homes are now equipped with a wide variety of electronic components, such as televisions, VCR's, cable boxes, stereo systems, and other audio-visual and computer related components. Because many of these components must be electrically interconnected, most people place these components in close proximity to each other. A preferred method of storage is to place the components in a common storage cabinet, frequently referred to as an entertainment center.

On a typical entertainment center, a VCR, stereo equipment, and other components can be stored in a single cabinet. For reasons of aesthetics, such cabinets are frequently, although not always, constructed of wood. Because many of these components are electrically interconnected, e.g., the television may be connected to the VCR, the cable box, the stereo, and to a set of auxiliary speakers, each of the electronic components includes a plurality of plugs, ports, and/or connectors designed to accommodate the various wires and patch cords that enable to components to function together. The connecting plugs, ports and connectors are invariably located on the rear portion of each of the components. Thus, the area behind the components typically resembles a jumbled maze of interwoven wires.

As old components are replaced or as new components are added to the system, the user must gain access to the wires in order to disconnect, replace, and/or re-connect the various wires, plugs and/or cords. Because a typical entertainment center is a substantial piece of furniture and thus very difficult to move, many people gain access to the wires by simply pulling the offending component partially out of the cabinet. The plurality of wires makes it difficult to pull any single component out very far, and the user runs the risk of inadvertently disconnecting the wrong component. Other more limber users attempt to reach behind the wall of components. This approach requires the user to connect and disconnect the proper wires without being able to discern which wires, plugs, or ports are involved. Accordingly, there exists a need for a cabinet or entertainment center that would allow easy and convenient access to the rear of the electronic components stored therein.

SUMMARY OF THE INVENTION

According to one aspect of the invention, a cabinet for housing electronic components comprises an enclosure having a top portion, a bottom portion, and a pair of interconnecting sidewalls. A panel includes first and second vertical edges, with the first vertical edge being pivotally connected to one of the enclosure sidewalls in order to permit the panel to be shifted between a first position in which the panel is disposed generally parallel to the enclosure first sidewall, and a second position in which the panel is disposed generally perpendicular to the enclosure first sidewall. A shelf unit is adapted to receive the electronic components, each of which may include a rear-wired portion. The shelf unit is slidably mounted to the panel such that the shelf unit is shiftable along a horizontal path. The shelf unit is shiftable between a stowed position in which the shelf unit is disposed within the enclosure and an extended position in which the shelf unit extends from the enclosure. Accordingly, upon sliding the shelf unit to the extended position the panel may be pivoted to the second position, thereby providing access to the rear wired portion of the electronic components stored on the shelf unit.

In further accordance with a preferred embodiment, the shelf unit includes a top portion, a bottom portion, and interconnecting sides. One of the shelf unit sides is disposed adjacent and parallel to the panel and is slidably mounted to the panel by at least one drawer slide, or by at least a pair of drawer slides. A member is mounted to the panel and extends over the shelf unit top portion. The shelf unit top portion is slidably connected to the member by a top drawer slide. The top drawer slide and the side drawer slide each includes an elongated cross-section, with the top drawer slide cross-section being oriented perpendicular the cross-section of the side drawer slide. The top drawer slide is adapted to prevent rotation of the shelf unit about an axis perpendicular to the panel vertical edges. When the drawer slides are so configured, the side drawer slides are positioned to carry a generally vertical load, while the top drawer slide is positioned to carry a generally horizontal load.

The panel is mounted to the enclosure by a hinge mechanism. The hinge mechanism may take the form of a plurality of hinges, although preferably a piano hinge is used. Moreover, the shelf unit includes a plurality of shelves, each of the shelves being adapted to receive an electronic component, and the enclosure includes a front opening having a lateral dimension. The panel includes a lateral dimension that is less than the front opening lateral dimension to thereby permit the panel to substantially occupy the front opening when the panel is disposed in the second position.

In accordance with another aspect of the invention, an entertainment center for housing an electronic component having a rear wired portion comprises an enclosure having a front portion having an aperture, a rear portion, and a pair of interconnecting sides. A panel includes first and second vertical edges, with the first vertical edge being pivotally mounted to the enclosure front portion to thereby permit the panel to be shifted between a first position in which the panel is disposed generally parallel to the enclosure sides, and a second position in which the panel is disposed generally perpendicular to the enclosure sides. A shelf unit is adapted to receive the electronic component, and the shelf unit is slidably mounted to the panel. The shelf unit is shiftable along a horizontal path between a stowed position in which the shelf unit is disposed substantially within the enclosure and an extended position in which the shelf unit extends from the enclosure. Accordingly, upon sliding the shelf unit to the extended position the panel may be pivoted to the second position, thereby providing access to the rear wired portion of the electronic component disposed on the shelf unit.

According to yet another aspect of the invention, an entertainment center for housing an electronic component having a rear wired portion comprises an enclosure having a front portion having an aperture, a rear wall, and a pair of interconnecting sides. A panel includes first and second vertical edges, with the first vertical edge being pivotally mounted to the enclosure front portion to thereby permit the panel to be shifted between a first position in which the panel is disposed generally parallel to the enclosure sides, and a second position in which the panel is disposed generally perpendicular to the enclosure sides. A shelf unit is adapted to receive the electronic component. The shelf unit includes a slide mechanism adapted to permit the shelf unit to be shiftable along a horizontal path between a stowed position in which the shelf unit is disposed substantially within the enclosure and an extended position in which the shelf unit extends from the enclosure. The slide mechanism is further adapted to prevent rotation of the shelf unit about a horizontal axis. Upon sliding the shelf unit to the extended position the panel may be pivoted to the second position, thereby providing access to the rear wired portion of the electronic component disposed on the shelf unit.

Additional features and advantages of the present invention will become readily apparent to those skilled in the art upon reading the following detailed description.

BRIEF DESCRIPTION OF THE DRAWINGS

FIG. 8 is an enlarged fragmentary elevational view, taken about the circumscribed portion of FIG. 3; and FIG. 9 is an enlarged fragmentary elevational view taken about the circumscribed portion of FIG. 3.

DETAILED DESCRIPTION OF THE INVENTION

The embodiments described herein are not intended to limit the scope of the invention to the precise forms disclosed. The embodiments have been chosen and described in order to explain the principles of the invention and its practical use in order to enable others skilled in the art to follow its teachings.

Figure 1:
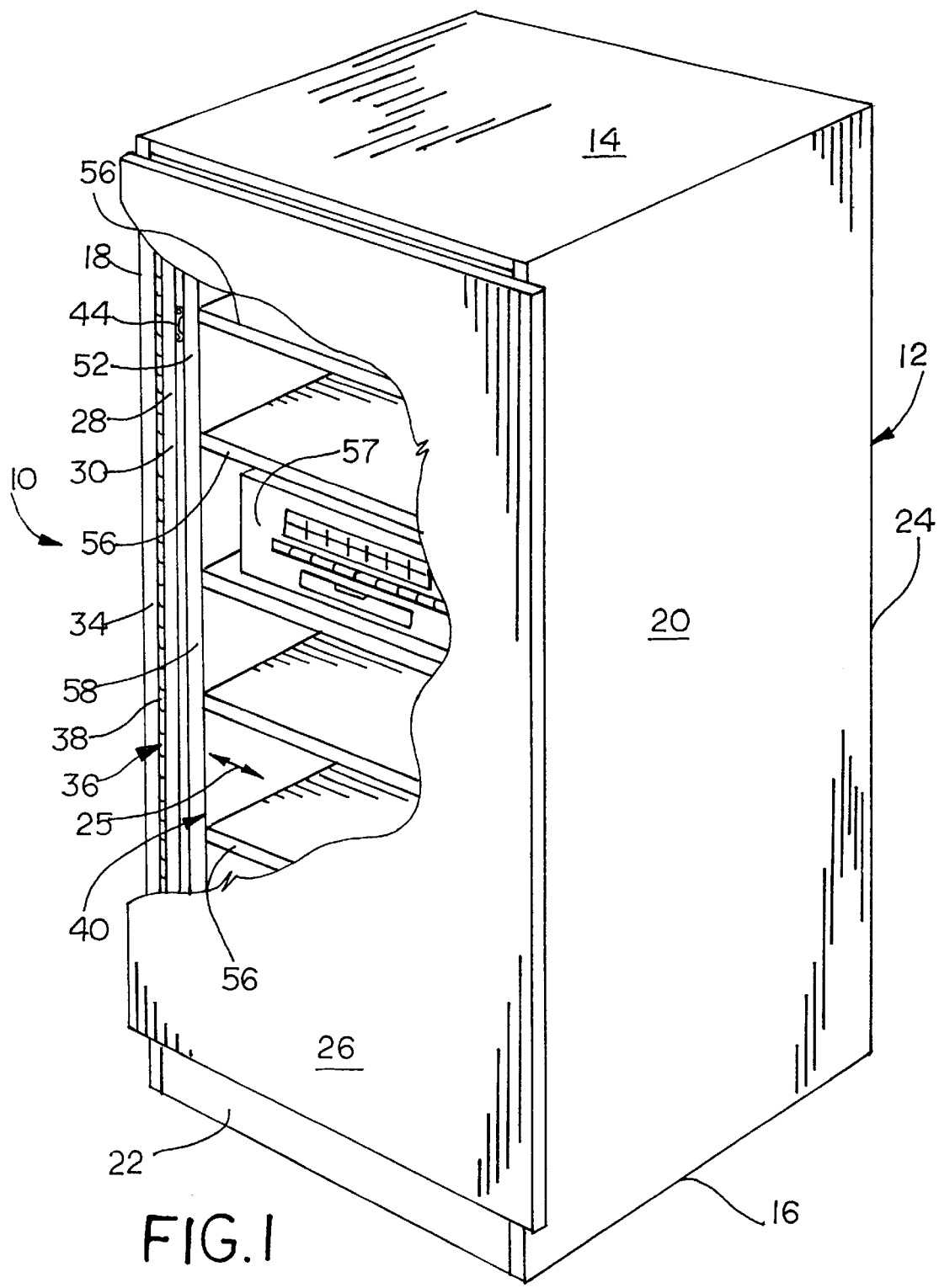
FIG. 1 is a perspective view, partly in cut away, of an entertainment center assembled according to the teachings of the present invention.

Referring now to the drawings, FIG. 1 illustrates an entertainment center assembled in accordance with the teachings of the present invention and generally referred to by the reference numeral 10. The entertainment center 10 includes a cabinet 12 having a top portion or wall 14, a bottom portion or wall 16 and a pair of interconnecting sidewalls 18 and 20. The cabinet 12 also includes a front side 22 and a rear side 24. A front opening 25 is defined in the front side 22. Preferably, a front door 26, which is preferably a "pocket" door of the type commonly employed in the art, is mounted to the cabinet 12 generally adjacent to the front side 22 of the cabinet 12. As would be known to those skilled in the art, the front door 26 is shiftable between the position of FIG. 1 in which the front door 26 generally covers the front opening 25 of the cabinet 12, and the stowed position in which the front door 26 is disposed inside of the cabinet 12 generally adjacent to the sidewall 20 as is shown in FIGS. 3 through 7, leaving the front opening 25 uncovered.

Figure 2:
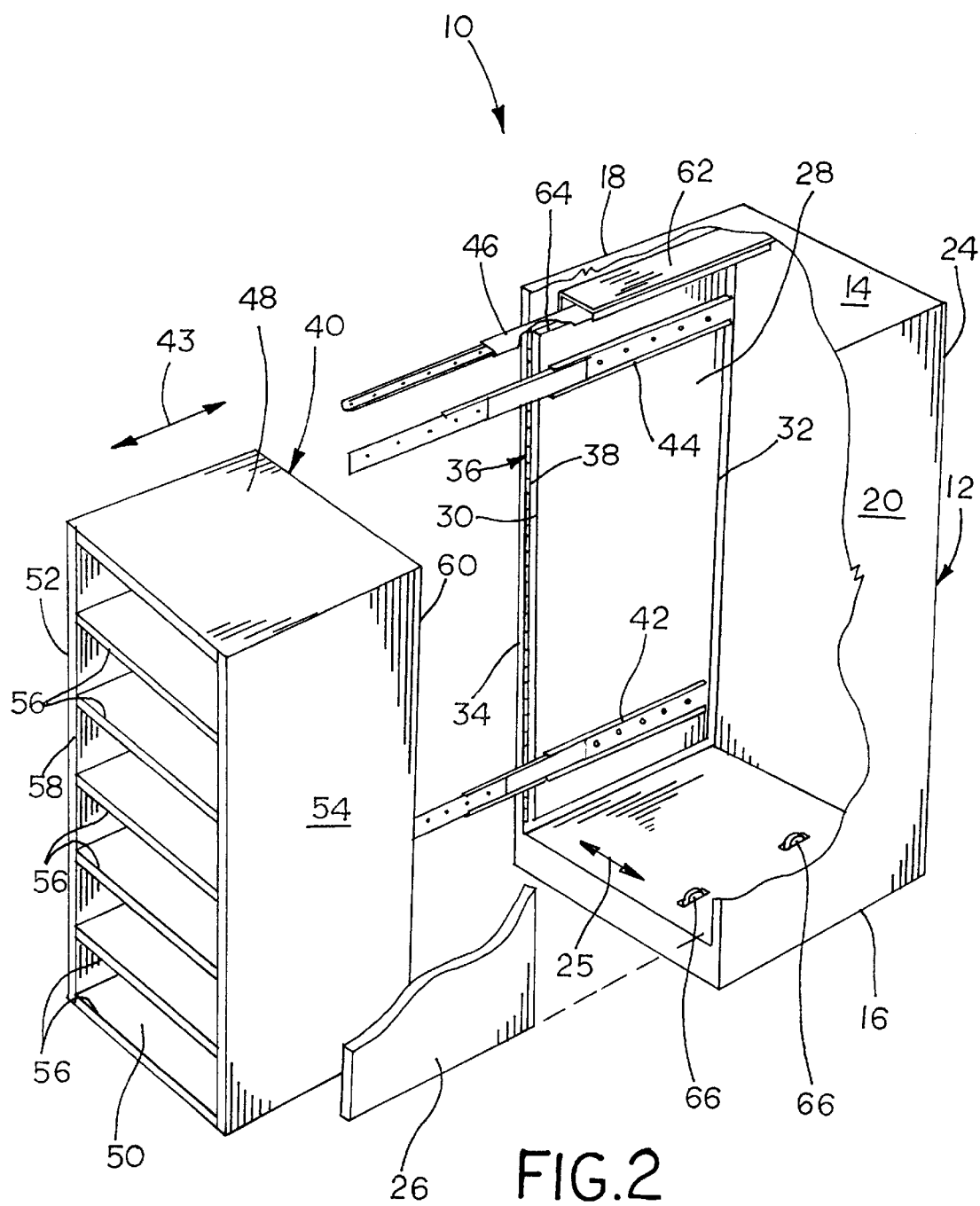
FIG. 2 is an exploded view in perspective of the entertainment center shown in FIG. 1.

As shown in FIG. 2, a panel 28 includes a front vertical edge 30 and a rear vertical edge 32. The front vertical edge 30 is mounted to a front edge 34 of the sidewall 18 by a hinge assembly 36. In the embodiment shown, the hinge assembly 36 is a piano hinge 38, such as a Larsen & Shaw Model No. 1116JO8FB, having a brass finish and a 3 inch open width. Other suitable substitutes may be employed. Alternatively, the hinge assembly 36 may include two or more conventional hinges, or a variety of other hinge mechanisms as are commonly employed in the cabinet making art. It will be understood that the lateral dimensions of the panel 28 are such that the panel will be shiftable between the position shown in FIG. 4 to the position shown in FIG. 6 (i.e., the lateral dimensions of the panel 28 are less than the lateral dimensions of the front opening 25).

Figure 3:
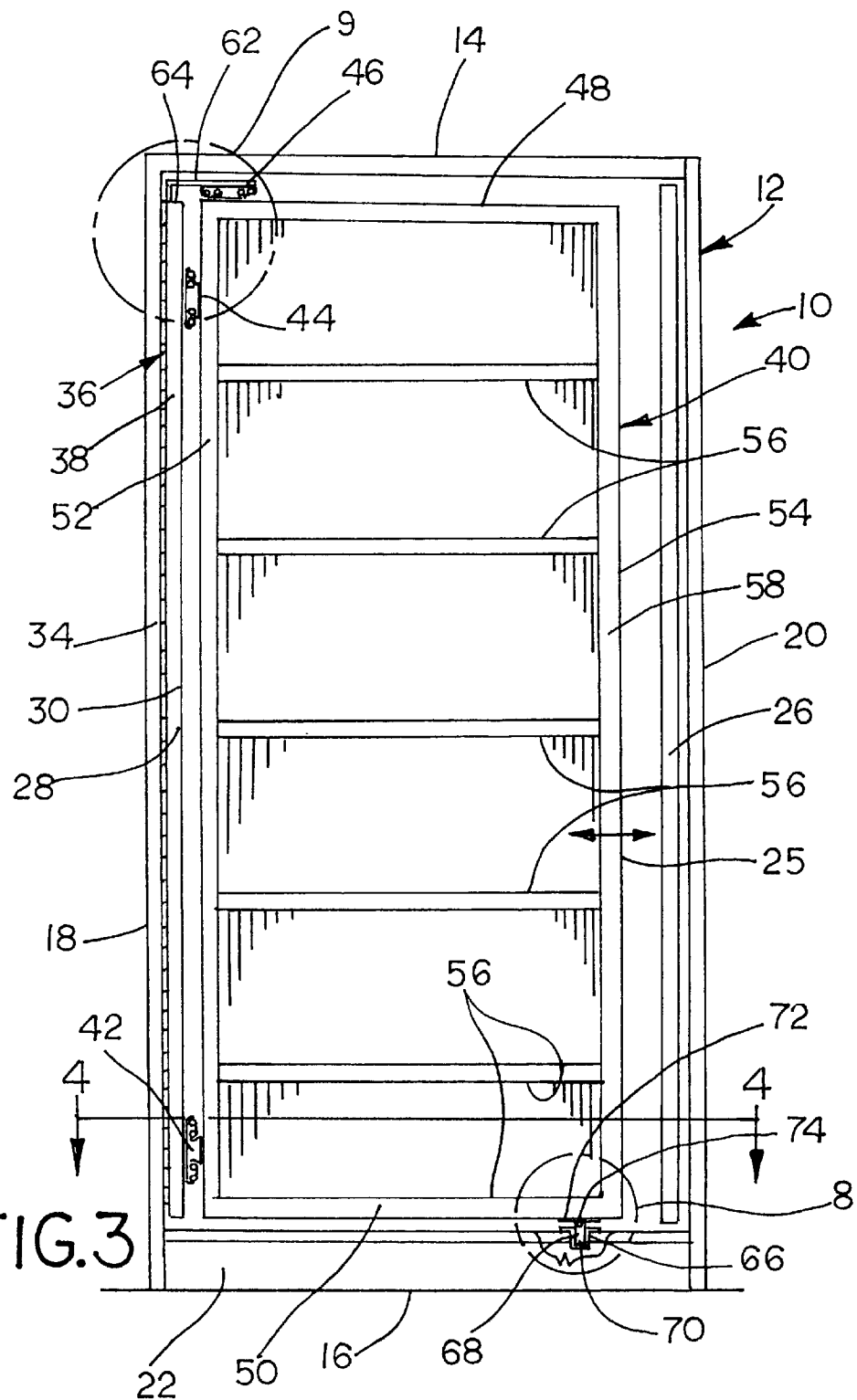
FIG. 3 is a front elevational view of the entertainment center shown in FIGS. 1 and 2 and showing the front or "pocket" door in the open position.
Figure 4:
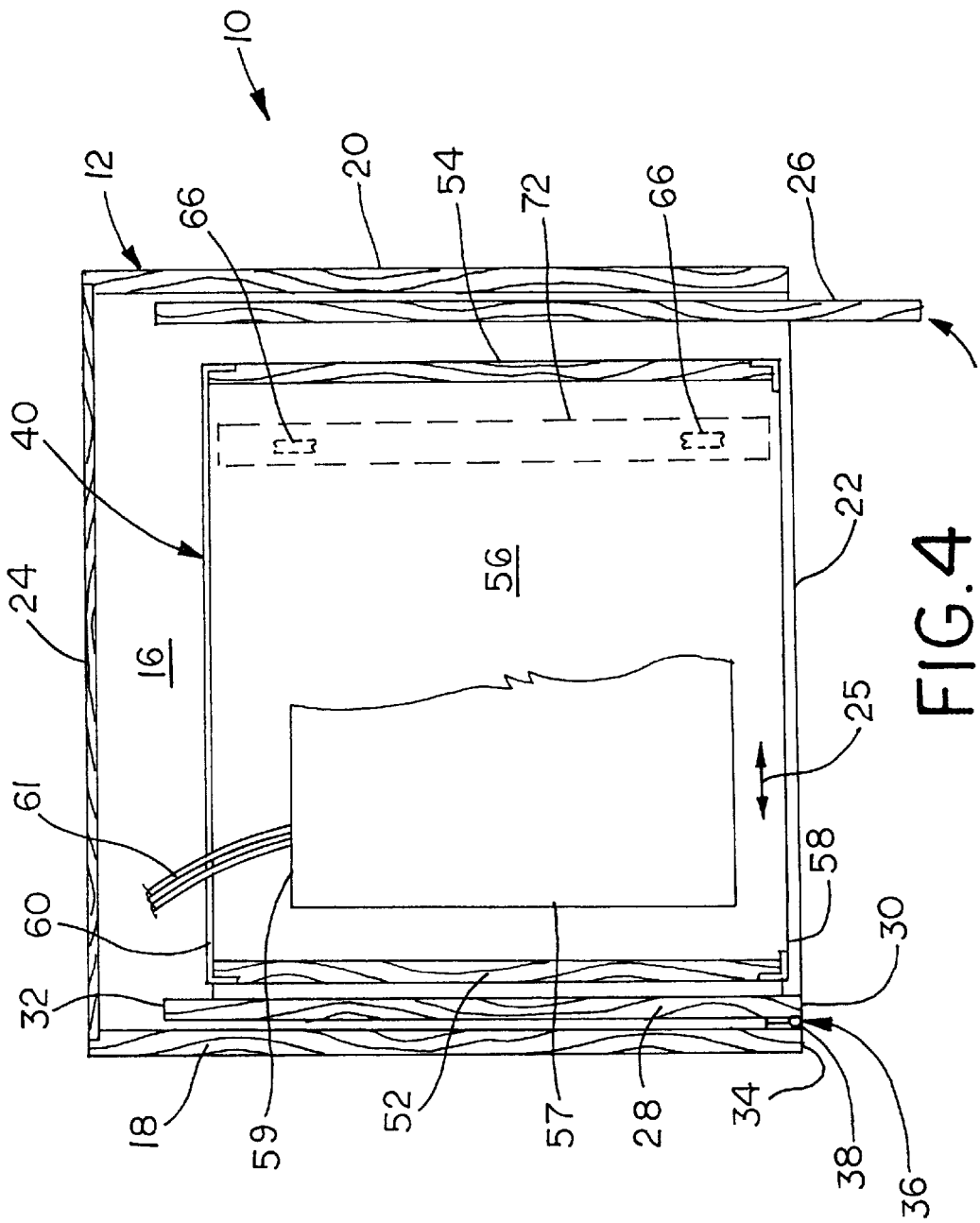
FIG. 4 is a cross-sectional view taken along line 4—4 of FIG. 3 and illustrating the pull out shelf unit disposed within the cabinet.

Referring now to FIGS. 2 and 3, a shelf unit 40 is slidably mounted to the panel 28 by a plurality of drawer slides 42, 44 and 46. The shelf unit 40 includes a top wall 48, a bottom wall 50, a pair of sidewalls 52, 54 and a plurality of shelves 56. As shown in FIG. 2, the shelf unit 40 includes a front side 58 and a rear side 60. Each shelf 56 is adapted to, carry thereon an article, such as an electronic component 57 (shown in each of FIGS. 1, 5 and 7), such that a rear wired portion 59 of the electronic component 57 is disposed generally adjacent to the rear side 60 of the shelf unit 40. The shelf unit 40 may be manufactured of wood, but preferably includes a steel subframe or steel reinforcing sections in order to provide resistance to racking or other load induced deformations.

The drawer slides 42 and 44 slidably connect the sidewall 52 to the panel 28. The drawer slides 42 and 44 are preferably Model No. 9301, eighteen inch units, manufactured by Accuride Corporation having a rated capacity of three hundred and fifty (350) pounds. As shown in FIGS. 2 and 3, an "L" shaped bracket 62, preferably of steel, is mounted to a top edge 64 of the panel 28 so as to extend out over a portion of the top wall 48 of the shelf unit 40. The drawer slide 46 slidably connects the top wall 48 of the shelf unit 40 to the bracket 62, which effectively slidably connects the top wall 48 to the panel 28. The drawer slide 46 is preferably a Model No. 3832, eighteen inch unit, also manufactured by Accuride Corporation and having a rated capacity of one hundred (100) pounds. (of course, other drawer slide capacities may be used depending on the design load of the cabinet.

As shown in FIG. 2, each drawer slide 42, 44 and 46 is in a direction generally parallel to an axis 43. As shown in FIG. 9, the drawer slide 44 (and similarly the drawer slide 42) include a cross-section having an elongated axis 45. The elongated axis 45 of each drawer slide 42 and 44 is disposed generally perpendicular to the axis 43 and generally parallel to the plane of the panel 28. The drawer slide 46 also includes an elongated axis 47, which is disposed generally perpendicular to the plane of the panel 28 and generally parallel to the plane of the top wall 14 of the cabinet 12.

Referring now to FIGS. 2, 3 and 8, a pair of open wheel sheaves 66 are mounted to the bottom wall 16 of the cabinet 12. Each open wheel sheave unit is preferably either a Model No. 429 or a Model No. 592, manufactured by Knapp &

Vote of Grand Rapids, Mich. Each open wheel sheave 66 includes a wheel 68 having a recessed groove 70, and each sheave 66 is preferably recessed in the bottom wall 16 as shown in FIG. 8 so that only a portion of the wheel 68 extends above the bottom wall 16 of the cabinet 12. A track 72 having a protruding "V" shaped portion 74 is mounted to the bottom wall 50 of the shelf unit 40, such as by conventional fasteners. The track 72 is also obtainable from Knapp & Vote. As shown in FIG. 8, the track 72 is positioned such that the "V" shaped portion 74 fits into the groove 70 of the wheel 68 of each sheave 66. The sheaves 66 and the track 72 permit the shelf unit 40 to be extended and retracted smoothly as the "V" shaped portion 74 moves over the rolling wheel 68. It will be understood that when the shelf unit 40 is fully extended and ready to be rotated about the hinge assembly 36 as will be explained in greater detail below, the track 72 will lose contact with the wheel 68 of each sheave unit 66.

In operation, when the entertainment center 10 is normally disposed such that the front door 26 is substantially in the position of FIG. 1 with the front door 26 covering the front opening 25 and concealing one or more electronic components 57 stored on the shelves 56 of the shelf unit 48. It will be noted that in some applications, a user may prefer that the front door 26 have a window (not shown). It will also be understood that each of the one or more electronic components 57 will typically have a rear portion 59 disposed generally adjacent to the rear side 60 of the shelf unit 40, which component rear portion typically includes a plurality of connecting wires 61 (visible in FIGS. 5 and 7) such as speaker wires, patch cords, cable and VCR input and output cords, or other wires.

As is well known to most consumers, the electronic components 57 are accessible for purposes of tuning or for turning the components on or off simply by opening the front door 26. As outlined above, after opening the front door 26, the front door 26 is preferably slidable in a generally rearward direction to the position shown in FIG. 3 or 4.

On certain occasions, the user may wish to gain access to the rear-wired portion 59 of the electronic components stored on the shelves 56 for purposes of connecting or disconnecting wires 61 in order to install, move, remove and/or service the components 57 stored on the shelves 56. In order to do so, the shelf unit 40 is shifted from the stowed position shown in FIG. 4 (in which the shelf unit 40 is substantially housed within the cabinet 12), toward the extended position shown in FIG. 5 (in which the shelf unit 48 is extended out of the cabinet 12). When in the extended position of FIG. 5, the shelf unit 40 is supported by the drawer slides 42, 44 and 46. As the shelf unit 40 is being extended, a portion of the shelf unit 40 is supported by the open wheel sheaves 66, by virtue of the "V" shaped portion 74 of the track 72 riding in the groove 70 of the wheel 68. As the shelf unit 40 approaches the position of FIG. 5, the track 72 loses contact with the sheave units 66.

As shown in FIGS. 3 and 9, it will be noted that the drawer slides 42 and 44 carry a portion of the vertical load, as does the drawer slide 46. The drawer slide 46 further carries a horizontal load, thus helping to prevent any rotation of the shelf unit 40 about the axis 43. Of course, the drawer slides 42 and 44 further serve to provide resistance to rotation of the shelf unit 40 about the axis 43, but in many cases would be insufficient without the addition of the drawer slide 46. The drawer slides 42, 44 and 46 are sized so as to prevent "drooping" of the shelf unit as it is pulled out of the cabinet.

Figure 5:
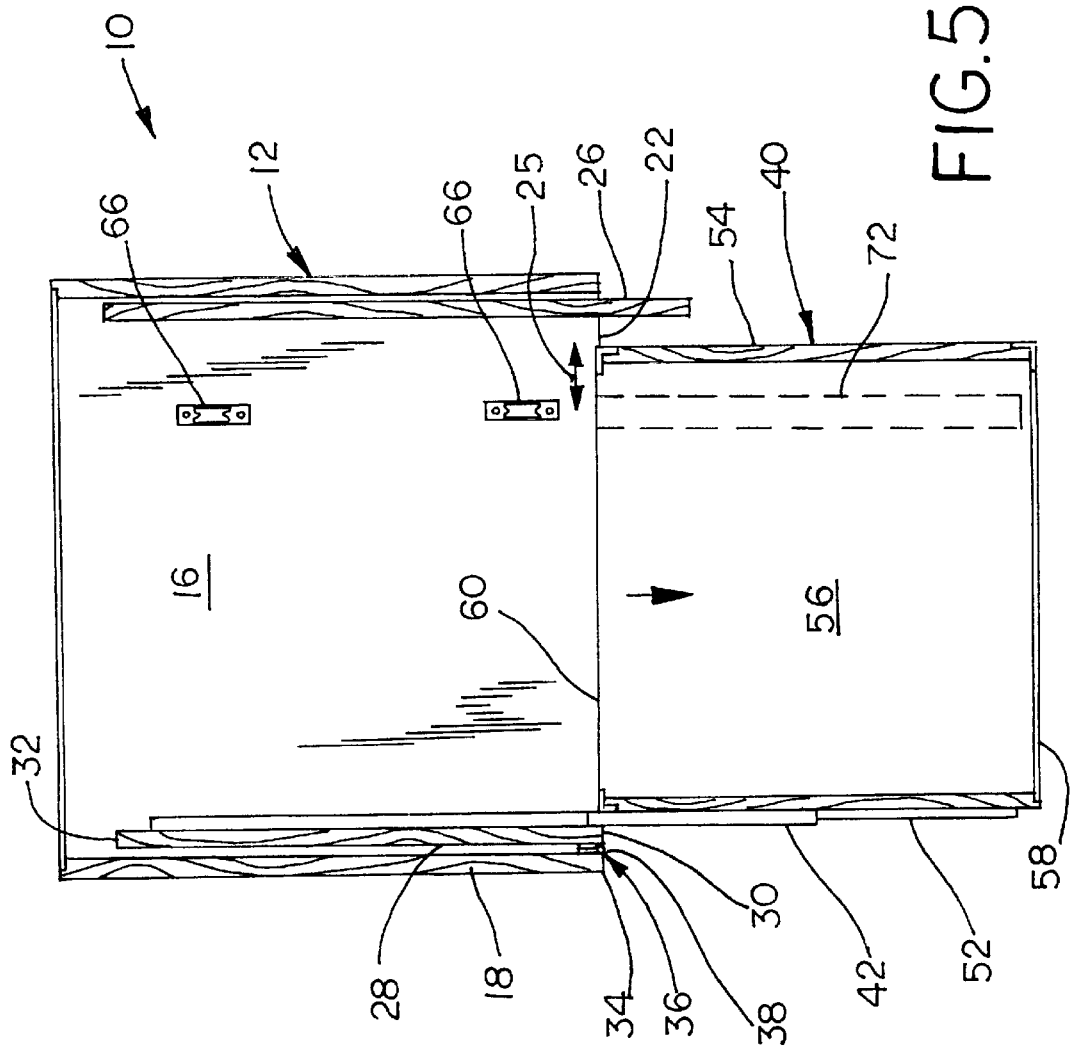
FIG. 5 is a cross-sectional view similar to FIG. 4 but illustrating the shelf unit in an extended position.
Figure 6:
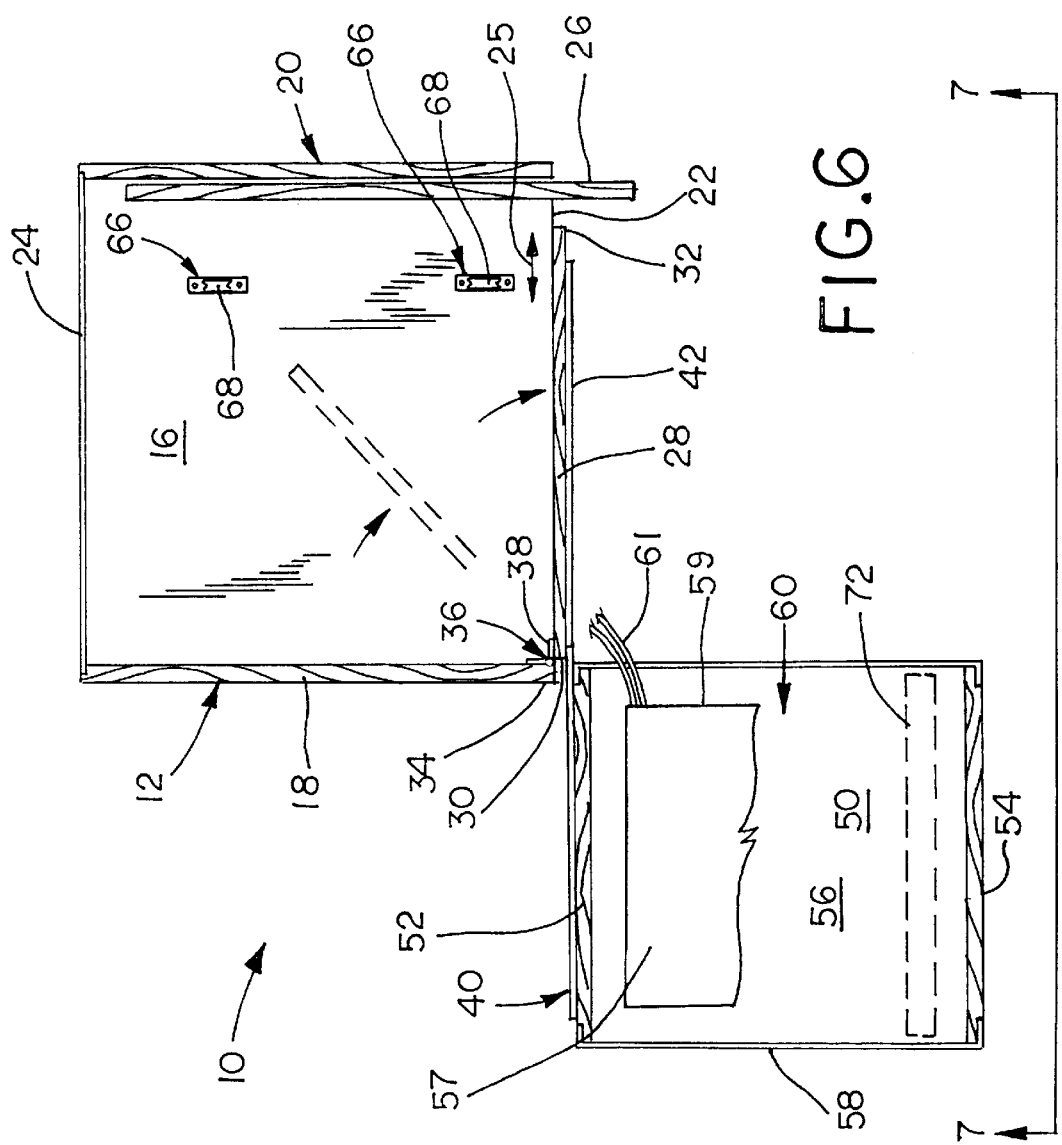
FIG. 6 is a cross-sectional view similar to FIG. 5 but illustrating the shelf unit rotated to provide access to a rear portion thereof.
Figure 7:
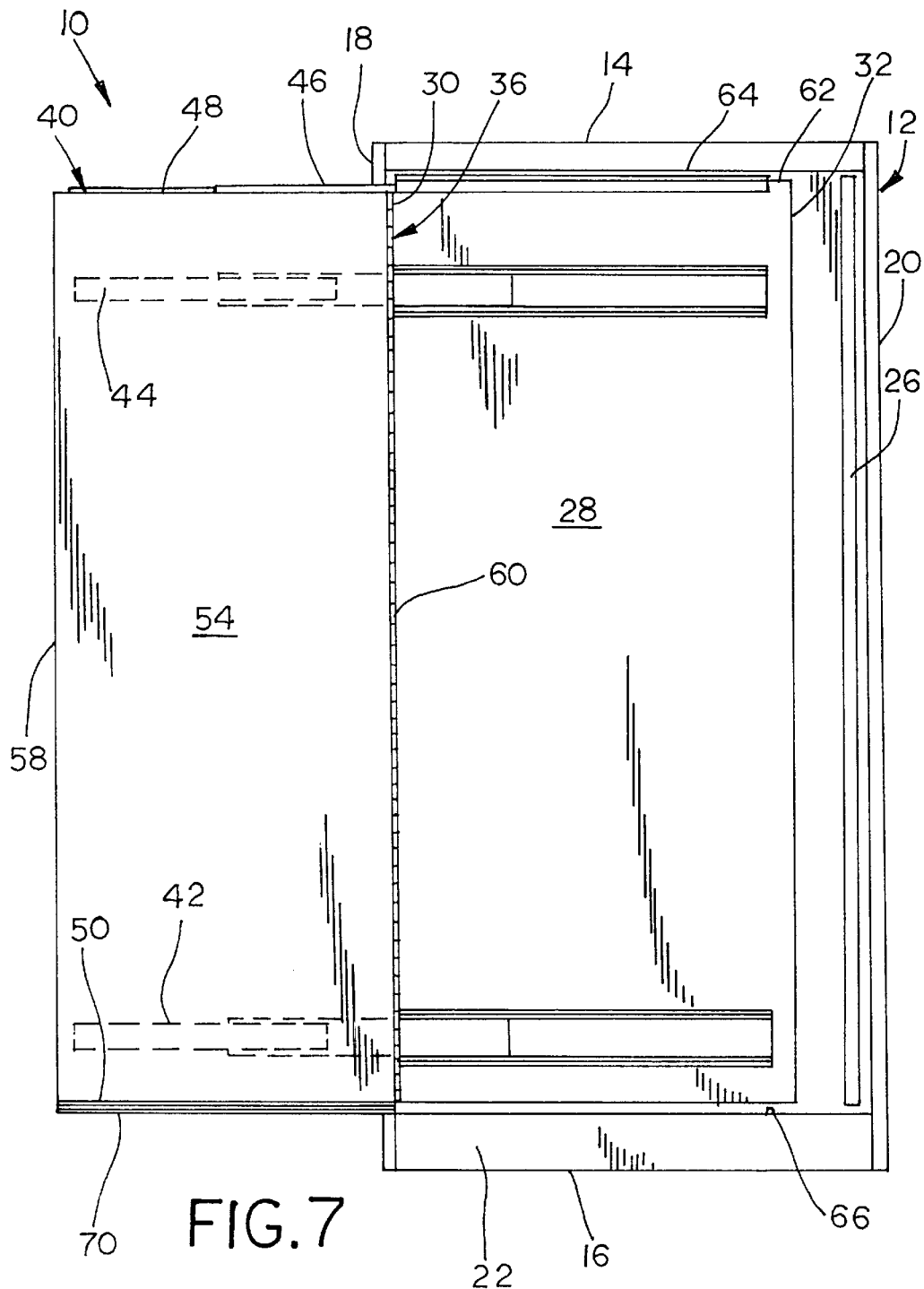
FIG. 7 is a front elevational view taken along line 7—7 of FIG. 6 and illustrating the shelf unit in the extended and rotated positions.

When the shelf unit 40 reaches the position of FIG. 5, the user may then rotate the shelf unit to the position of FIG. 6.

This is accomplished by rotating the panel 28 about the hinge assembly 36. As can be seen in FIG. 6, the rear vertical edge 32 of the panel 28 proceeds along a generally arcuate path when viewed from above. Because the panel 28 is sized so as to be smaller than the distance between the left sidewall 18 and the right sidewall 20, the rear vertical edge 32 does not make contact with the interior of the right sidewall 20 as the shelf unit 40 rotates.

After the user has gained access to the rear-wired portion 59 of the one or more electronic components 57 stored on the shelf unit 40 for the desired purpose, the user returns the shelf unit 40 to the stowed position be reversing the above process. The shelf unit is rotated about the hinge assembly 36 from the position of FIG. 6 back to the position of FIG. 5. From the position of FIG. 5, the user merely pushes the shelf unit 40 in a rearward direction. As the shelf unit 40 approaches the position of FIG. 4, the track 72 makes contact with the front sheave 66 and then with the rear sheave 66. The front door 26 may then be returned to a position covering the front opening 25 as is shown in FIG. 1.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

What is claimed:

1. A cabinet for housing electronic components, each of the electronic components having a rear wired portion, the cabinet comprising:

an enclosure having a top portion, a bottom portion, and first and second interconnecting sidewalls;

a panel including first and second vertical edges, the first vertical edge being pivotally connected to the enclosure first sidewall to thereby permit the panel to be shifted between a first position in which the panel is disposed generally parallel to the enclosure first sidewall, and a second position in which the panel is disposed generally perpendicular to the enclosure first sidewall; and a shelf unit adapted to receive the electronic components, at least a portion of the shelf unit being slidably mounted to the panel, the shelf unit being shiftable along a horizontal path between a stowed position in which the shelf unit is disposed within the enclosure and an extended position in which the shelf unit extends from the enclosure;

so that upon sliding the shelf unit to the extended position the panel may be pivoted to the second position, thereby providing access to the rear wired portion of the electronic components.

2. The cabinet of claim 1, wherein the shelf unit includes a top portion, a bottom portion, and interconnecting sides, one of the shelf unit sides being disposed adjacent and parallel to the panel and being slidably mounted to the panel by at least one drawer slide.

3. The cabinet of claim 2, wherein the one shelf unit side is slidably mounted to the panel by a pair of drawer slides.

4. The cabinet of claim 2, wherein the panel includes a member extending over the shelf unit top portion, the shelf unit top portion being slidably connected to the member by a top drawer slide.

5. The cabinet of claim 4, wherein the top drawer slide and the at least one side drawer slide each includes an elongated cross-section, the top drawer slide cross-section being oriented perpendicular the it least one side drawer slide cross-section.

6. The cabinet of claim 1, wherein the panel is mounted to the enclosure by a hinge mechanism.

7. The cabinet of claim 1, wherein the panel is mounted to the enclosure by a piano hinge.

8. The cabinet of claim 1, wherein the shelf unit includes a plurality of shelves, each of the shelves being adapted to receive an electronic component.

9. The cabinet of claim 1, wherein the enclosure includes a front opening having a lateral dimension and further wherein the panel includes a lateral dimension, the panel lateral dimension being less than the front opening lateral dimension to thereby permit the panel to substantially occupy the front opening when the panel is disposed in the second position.

10. For use with an electronic component having a rear wired portion, an entertainment center for housing the electronic component comprising:

an enclosure having a front portion having an aperture, a rear portion, and a pair of interconnecting sides;

a panel including first and second vertical edges, the first vertical edge being pivotally mounted to the enclosure front portion to thereby permit the panel to be shifted between a first position in which the panel is disposed generally parallel to the enclosure sides, and a second position in which the panel is disposed generally perpendicular to the enclosure sides; and a shelf unit adapted to receive the electronic component, the shelf unit being slidably mounted to the panel and being shiftable along a horizontal path between a stowed position in which the shelf unit is disposed substantially within the enclosure and an extended position in which the shelf unit extends from the enclosure;

so that upon sliding the shelf unit to the extended position the panel may be pivoted to the second position, thereby providing access to the rear wired portion of the electronic component disposed on the shelf unit.

11. The cabinet of claim 10, wherein the shelf unit includes a top portion, a bottom portion, and interconnecting sides, one of the shelf unit sides being disposed adjacent and parallel to the panel and being slidably mounted to the panel by at least one drawer slide.

12. The cabinet of claim 11, wherein the one shelf unit side is slidably mounted to the panel by a pair of drawer slides.

13. The cabinet of claim 11, wherein the panel includes a member extending over the shelf unit top portion, the shelf unit top portion being slidably connected to the member by a top drawer slide.

14. The cabinet of claim 13, wherein the top drawer slide and the at least one side drawer slide each includes an elongated cross-section, the top drawer slide cross-section being oriented perpendicular the at least one side drawer slide cross-section.

15. The cabinet of claim 10, wherein the shelf unit is slidably mounted to the panel by a plurality of drawer slides, at least one of the drawer slides being adapted to prevent rotation of the shelf unit about an axis perpendicular to the panel vertical edges.

16. The cabinet of claim 10, wherein the panel is mounted to the enclosure by a piano hinge.

17. The cabinet of claim 10, wherein the shelf unit includes a top portion, a bottom portion, and interconnecting sides, and including a slide mechanism slidably securing one of the sides to the panel and being adapted to carry a generally vertical load, and further including a top slide mechanism slidably securing the shelf unit top portion to the panel and being adapted to carry a generally horizontal load.

18. For use with an electronic component having a rear wired portion, an entertainment center for housing the electronic component comprising:

an enclosure having a front portion having an aperture, a rear wall, and a pair of interconnecting sides;

a panel including first and second vertical edges, the first vertical edge being pivotally mounted to the enclosure front portion to thereby permit the panel to be shifted between a first position in which the panel is disposed generally parallel to the enclosure sides, and a second position in which the panel is disposed generally perpendicular to the enclosure sides; and a shelf unit adapted to receive the electronic component, the shelf unit including a slide mechanism adapted to permit the shelf unit to be shiftable along a horizontal path between a stowed position in which the shelf unit is disposed substantially within the enclosure and an extended position in which the shelf unit extends from the enclosure, the slide mechanism further being adapted to prevent rotation of the shelf unit about a horizontal axis;

so that upon sliding the shelf unit to the extended position the panel may be pivoted to the second position, thereby providing access to the rear wired portion of the electronic component disposed on the shelf unit.

19. A cabinet for housing electronic components, each of the electronic components having a rear wired portion, the cabinet comprising:

an enclosure having a top portion, a bottom portion, and a pair of first and second interconnecting sidewalls;

a panel including first and second vertical edges, the first vertical edge being pivotally connected to the enclosure first sidewall to thereby permit the panel to be shifted between a first position in which the panel is disposed generally parallel to the enclosure first sidewall, and a second position in which the panel is disposed generally perpendicular to the enclosure first sidewall; and a shelf unit adapted to receive the electronic components and being slidably mounted to the panel by a plurality of drawer slides, at least one of the drawer slide being adapted to prevent rotation of the shelf unit about an axis perpendicular to the panel vertical edges, the shelf unit being shiftable along a horizontal path between a stowed position in which the shelf unit is disposed within the enclosure and an extended position in which the shelf unit extends from the enclosure;

so that upon sliding the shelf unit to the extended position the panel may be pivoted to the second position, thereby providing access to the rear wired portion of the electronic components.

20. A cabinet for housing electronic components, each of the electronic components having a rear wired portion, the cabinet comprising:

an enclosure having a top portion, a bottom portion, and first and second interconnecting sidewalls;

a panel including first and second vertical edges, the first vertical edge being pivotally connected to at least one of the enclosure sidewalls to thereby permit the panel to be shifted between a first position in which the panel is disposed generally parallel to the at least one enclosure sidewall, and a second position in which the panel is disposed generally perpendicular to the at least one enclosure sidewall; and a shelf unit adapted to receive the electronic components and being slidably mounted to the panel, the shelf unit being shiftable along a horizontal path between a stowed position in which the shelf unit is disposed within the enclosure and an extended position in which the shelf unit extends from the enclosure, the shelf unit having a top portion, a bottom portion, and interconnecting sides; and a slide mechanism slidably securing at least one of the shelf unit sides to the panel, the slide mechanism being adapted to carry a generally vertical load, the slide mechanism including a top slide mechanism slidably securing the shelf unit top portion to the panel and being adapted to carry a generally horizontal load;

so that upon sliding the shelf unit to the extended position the panel may be pivoted to the second position, thereby providing access to the rear wired portion of the electronic components.

* * * * *